(12) United States Patent
Zhu

(10) Patent No.: US 7,674,667 B2
(45) Date of Patent: Mar. 9, 2010

(54) CMOS STRUCTURE INCLUDING TOPOGRAPHIC ACTIVE REGION

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 11/562,093

(22) Filed: Nov. 21, 2006

(65) Prior Publication Data

US 2008/0116522 A1 May 22, 2008

(51) Int. Cl.
*H01L 21/336* (2006.01)
(52) U.S. Cl. .................. 438/198; 257/369; 257/64; 257/E21.598; 257/E27.112; 257/E33.003; 257/E29.003; 257/E21.036; 257/E21.233; 438/199; 438/150; 438/168; 438/187; 438/733
(58) Field of Classification Search .................. None
See application file for complete search history.

(56) References Cited

U.S. PATENT DOCUMENTS

| 4,891,120 A * | 1/1990 | Sethi et al. ............. 204/600 |
| 6,252,272 B1 * | 6/2001 | Watanabe et al. ........... 257/315 |
| 2005/0023569 A1 * | 2/2005 | Yang ........................ 257/213 |

| 2007/0241403 A1 * | 10/2007 | Thean et al. ............... 257/351 |

OTHER PUBLICATIONS

Weber, et al., "A Novel Locally Engineered (111) V-channel pMOSFET Architecture with Improved Drivability Characteristics for Low-Standby power (LSTP) CMOS Applications", 2005 Symposium on VLSI Technology Digest of Technical Papers, pp. 156-157.

* cited by examiner

*Primary Examiner*—Minh-Loan T Tran
*Assistant Examiner*—Fei Fei Yeung Lopez
(74) *Attorney, Agent, or Firm*—Scully, Scott, Murphy & Presser, P.C.; Ian D. MacKinnon, Esq.

(57) ABSTRACT

A CMOS structure includes a first device located using a first active region within a semiconductor substrate, where the first active region is planar and has a first crystallographic orientation. The CMOS structure also includes a second device that is located using a second active region within the semiconductor substrate, where the second active region is topographic and has a second crystallographic orientation absent the first crystallographic orientation. The first crystallographic orientation and the second crystallographic orientation allow for performance optimizations of the first device and the second device, typically with respect to charge carrier mobility. The topographic second active region may also have a single thickness. The CMOS structure may be fabricated using a crystallographically specific etchant for forming the topographic second active region.

14 Claims, 14 Drawing Sheets

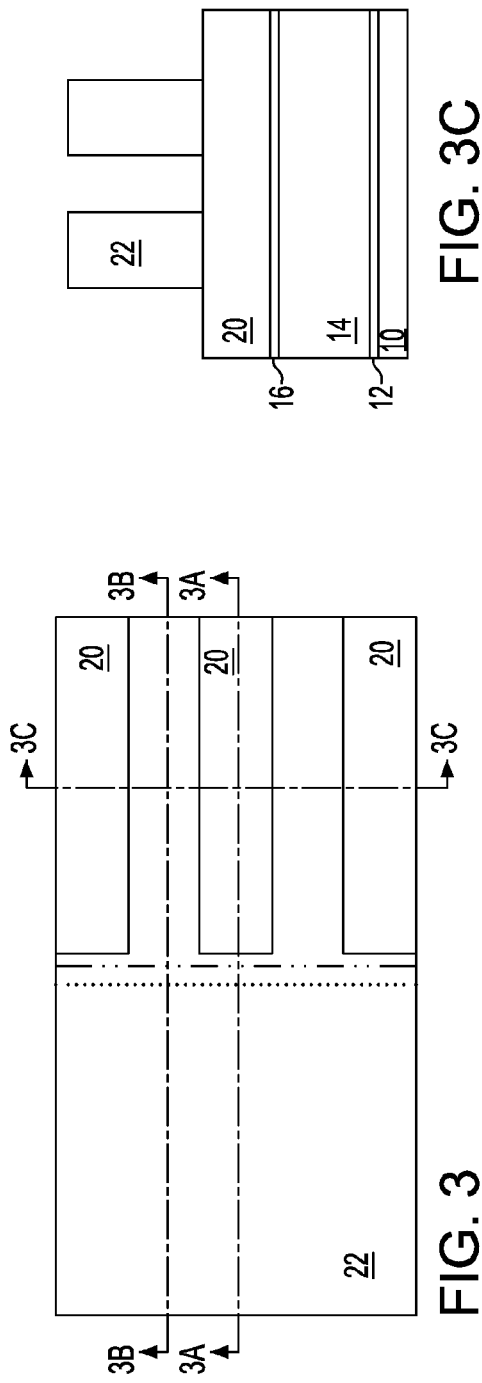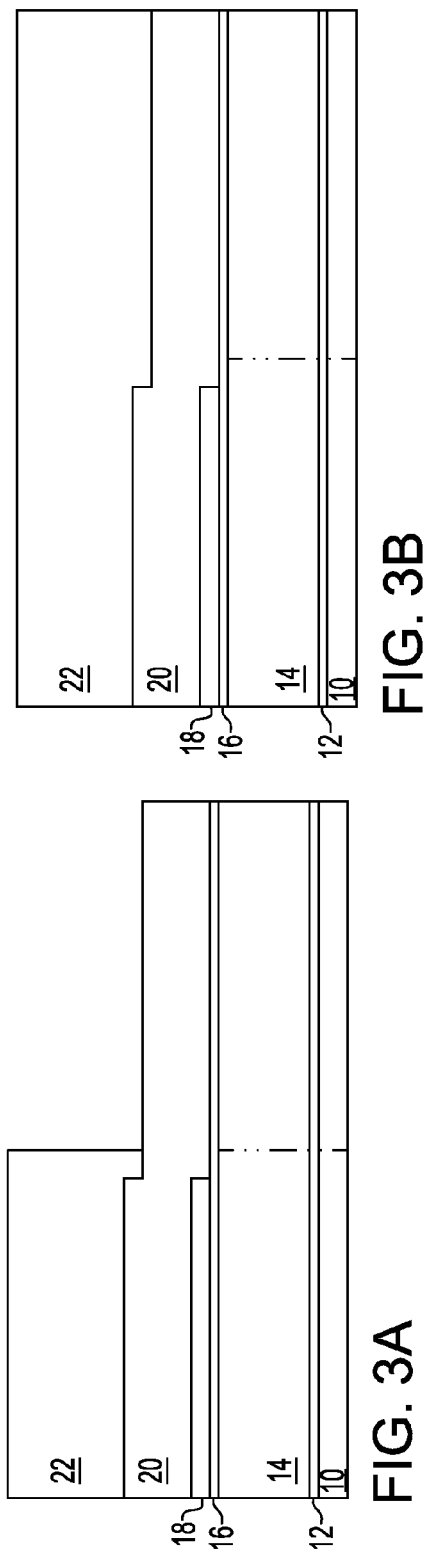

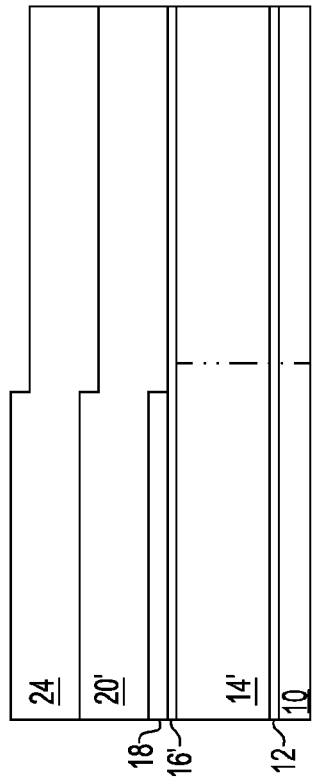
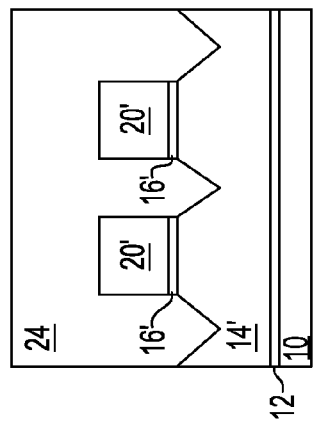
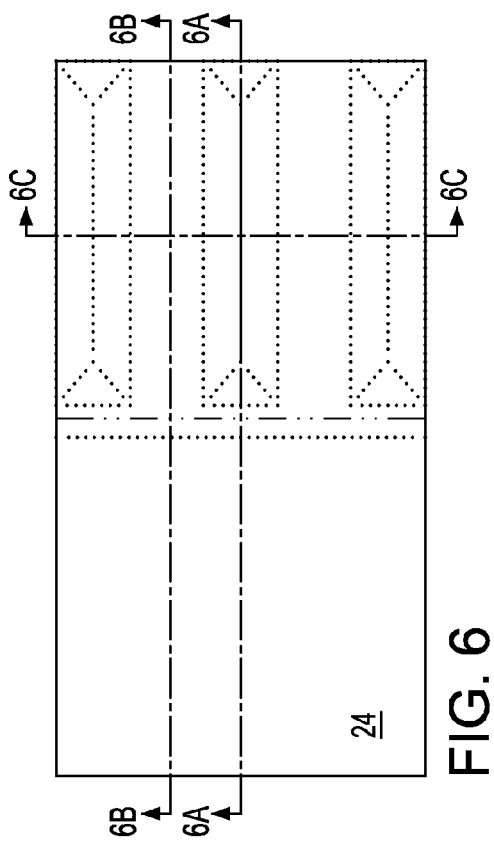
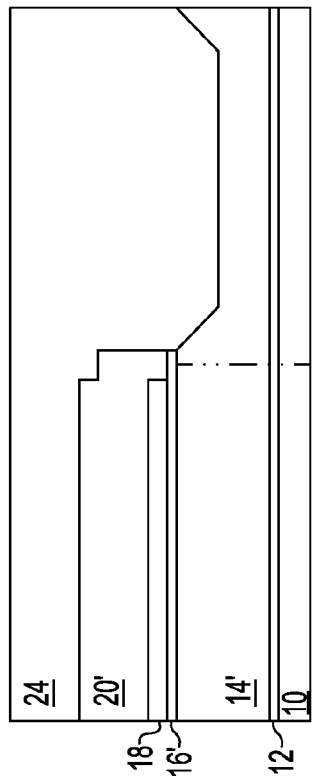

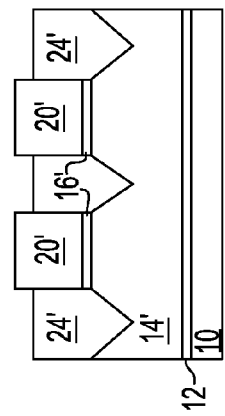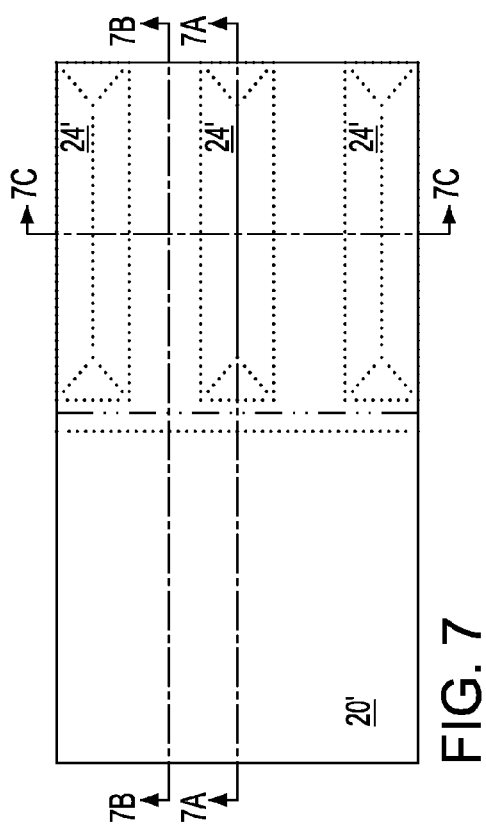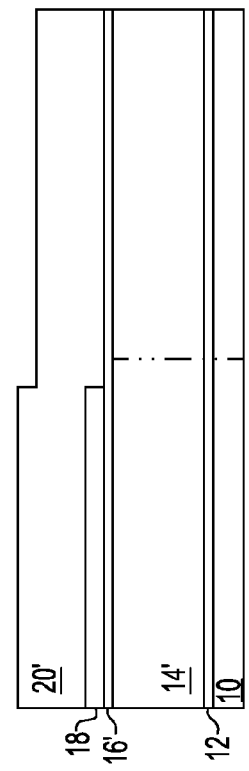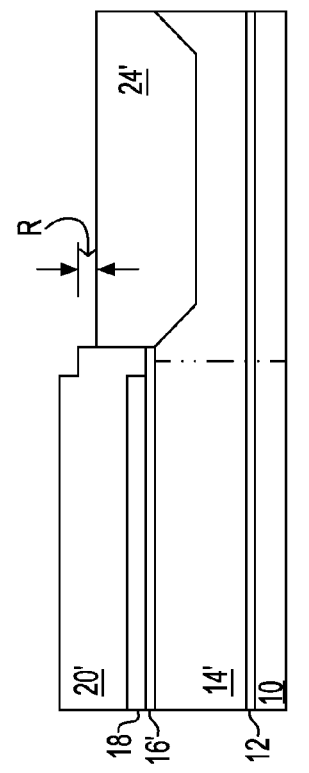
FIG. 7
FIG. 7C
FIG. 7A
FIG. 7B

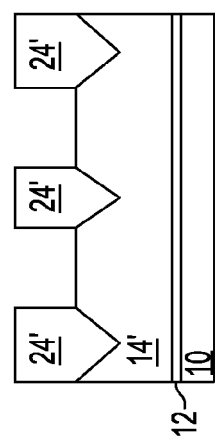
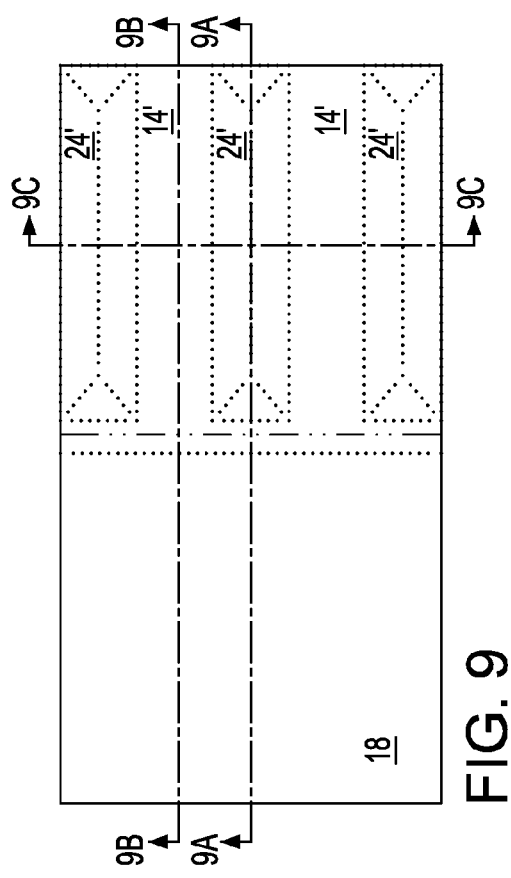
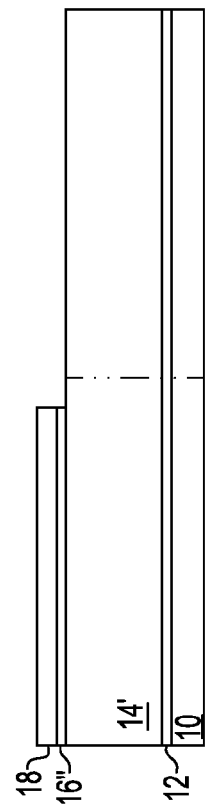
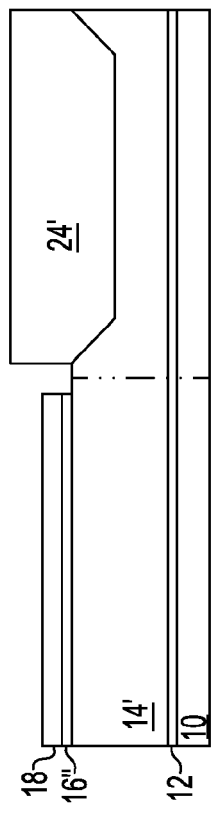

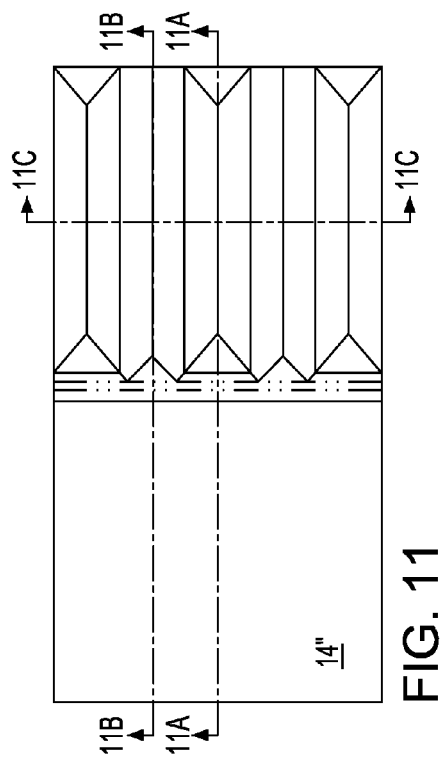
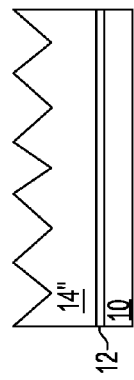
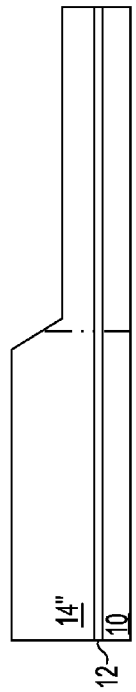

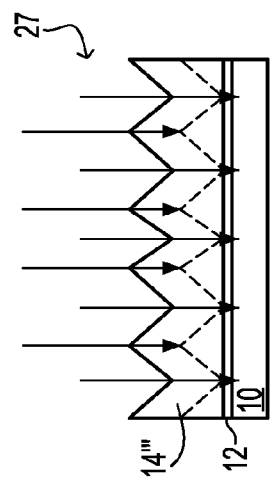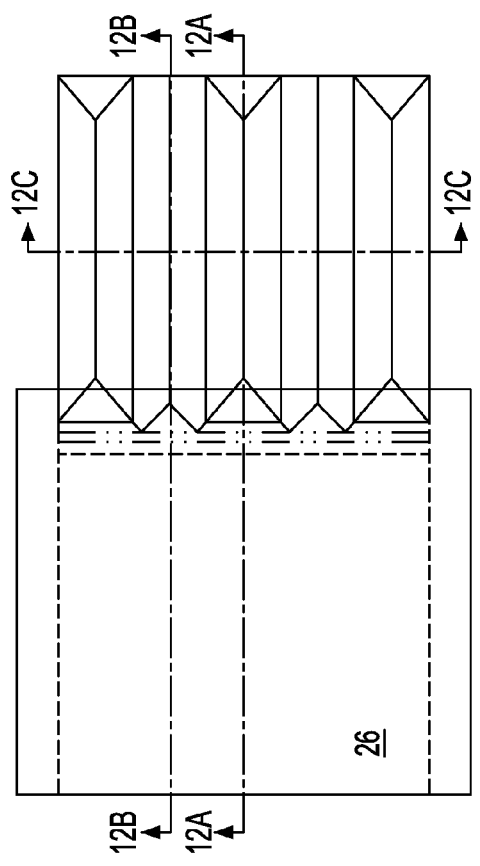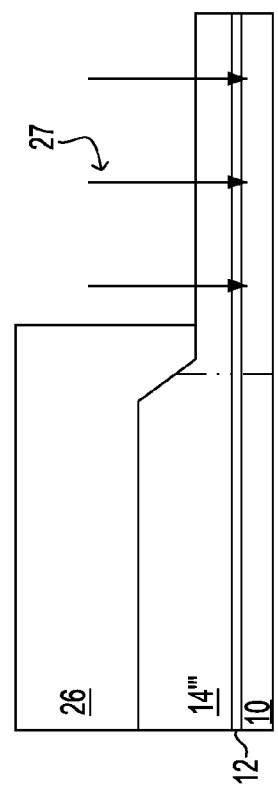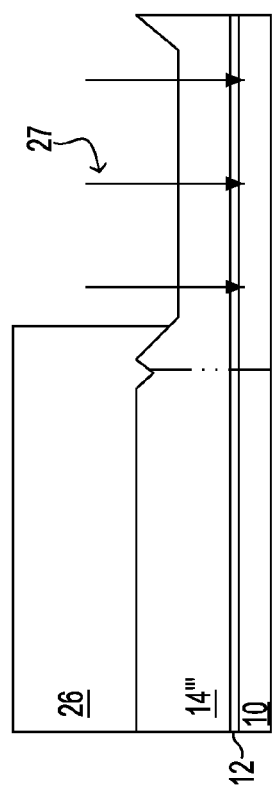
FIG. 12
FIG. 12A
FIG. 12B
FIG. 12C

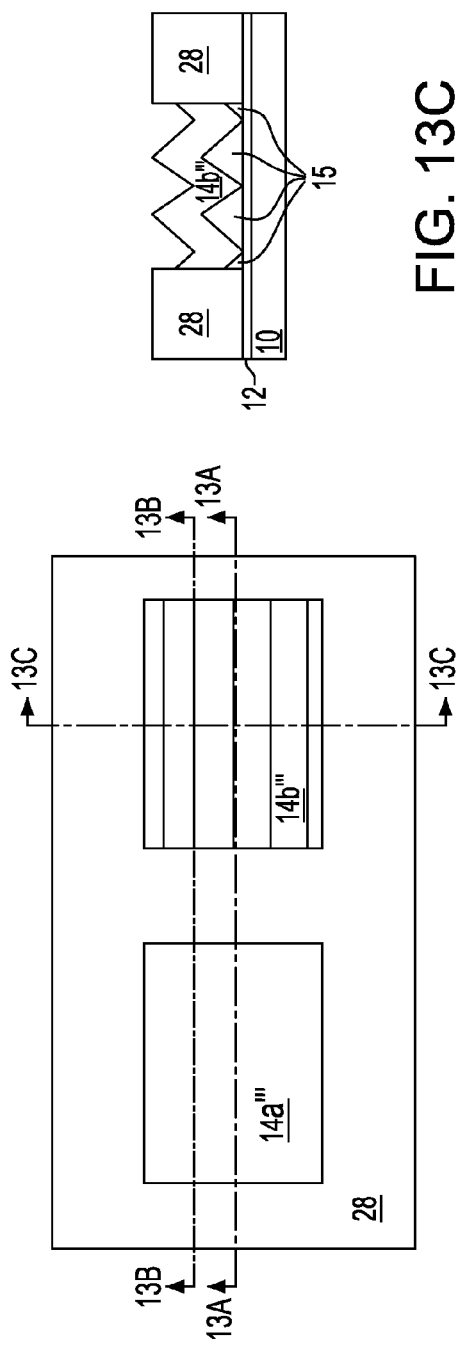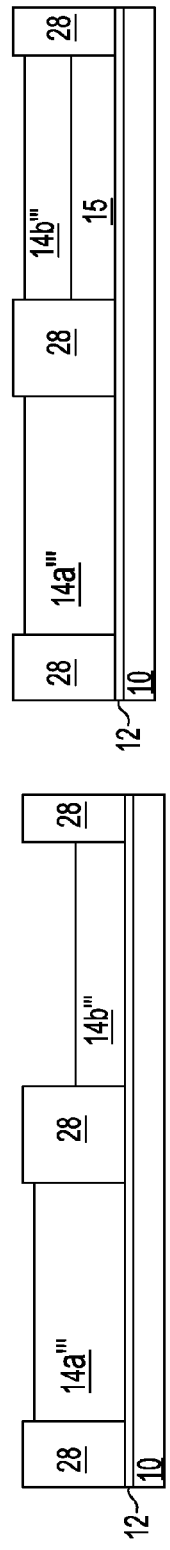
FIG. 13
FIG. 13A
FIG. 13B
FIG. 13C

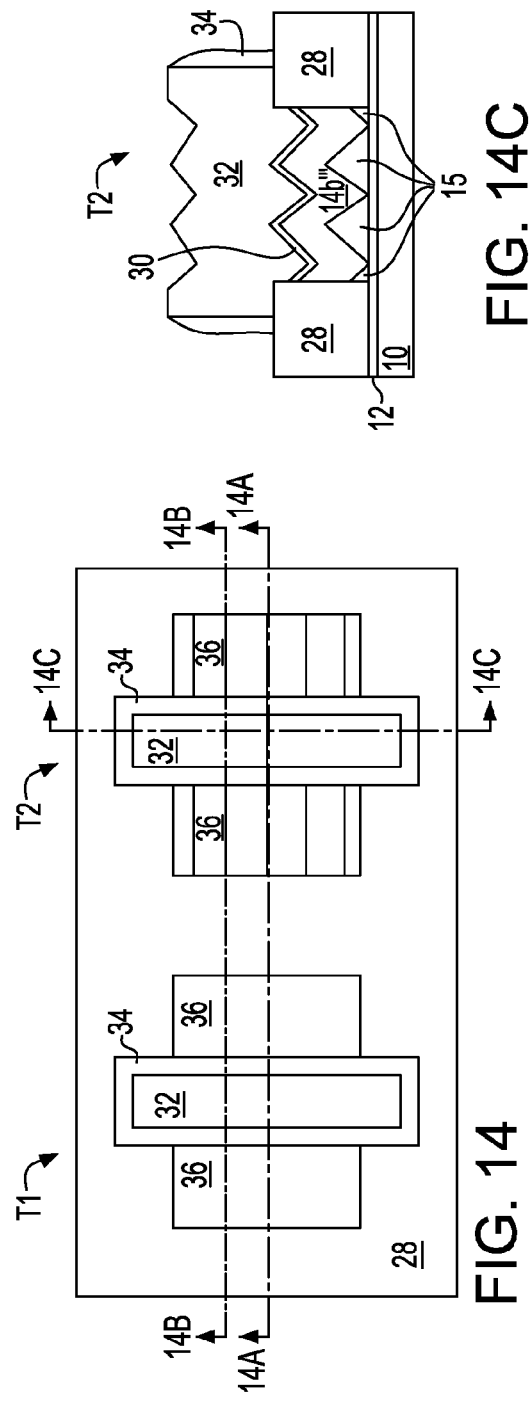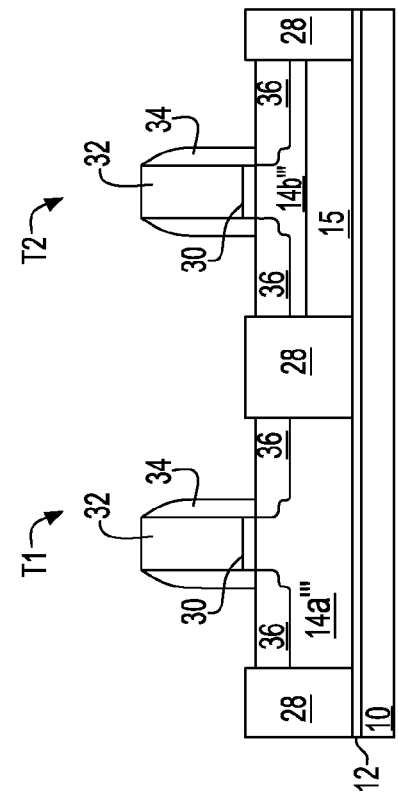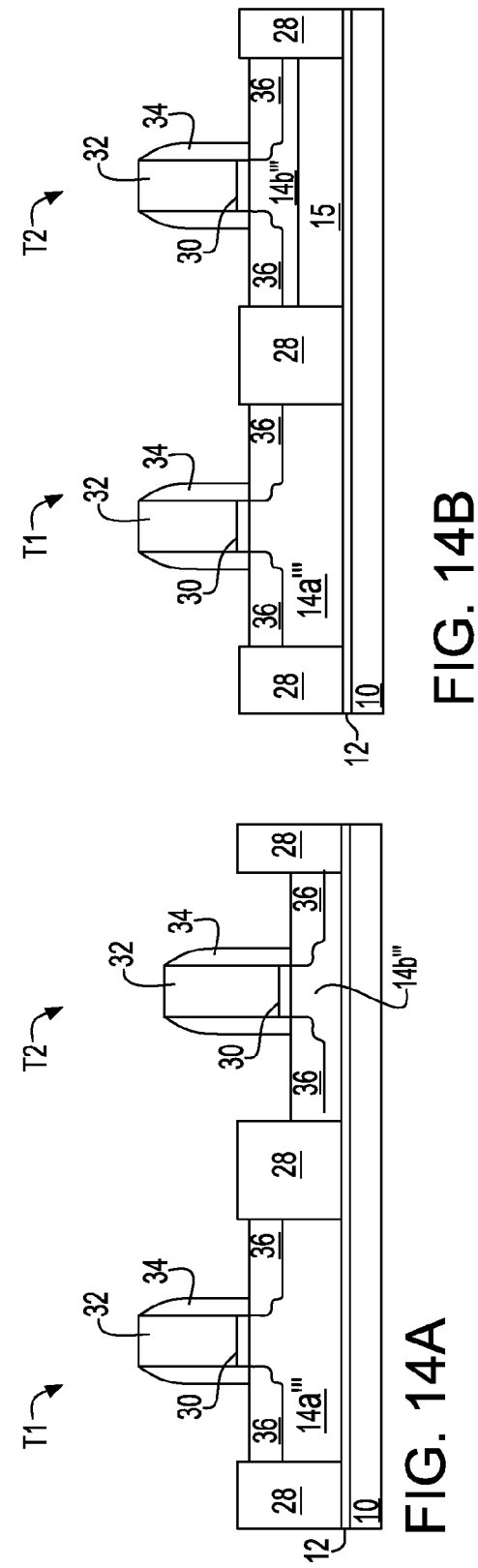

CMOS STRUCTURE INCLUDING TOPOGRAPHIC ACTIVE REGION

FIELD OF THE INVENTION

The invention relates generally to complementary metal oxide semiconductor (CMOS) structures. More particularly, the invention relates to CMOS structures having enhanced performance.

DESCRIPTION OF THE RELATED ART

Recent advances in CMOS design and fabrication have centered on the use of different semiconductor substrate crystallographic orientations when fabricating n-FET devices in comparison with p-FET devices within CMOS structures. Particular crystallographic orientations are known in the art to provide enhanced charge carrier mobility with respect to either electrons within an n-FET device or holes within a p-FET device. As a specific example, n-FET devices that are fabricated using a (100) silicon semiconductor substrate as a channel region are known to have enhanced electron mobility, while p-FET devices that are fabricated using a (111) or (110) silicon semiconductor substrate as a channel are known to have enhanced hole mobility.

While the use of different crystallographic orientation semiconductor substrate regions as channel regions for n-FET devices and p-FET devices certainly provides a performance advantage within CMOS structures, the use of different crystallographic orientation semiconductor substrate regions as channels for n-FET devices and p-FET devices is not entirely without problems within CMOS structures. In particular, different crystallographic orientation semiconductor substrate regions are often difficult to readily fabricate within CMOS structures. Conventional methods that provide different crystallographic orientation semiconductor substrate regions typically require the use of epitaxial methods for fabricating at least one of the different crystallographic orientation semiconductor substrate regions. Particular crystallographic regions that are formed using epitaxial methods often include defects. Also, epitaxial methods are often expensive.

CMOS structures having enhanced performance, and methods for fabrication thereof, are known in the semiconductor fabrication art. For example. Weber, in "A Novel Locally Engineered (111) V-channel pMOSFET Architecture with Improved Drivability Characteristics for Low-Standby power (LSTP) CMOS Applications," 2005 VLSI Tech. Symp. Dig., pp. 156-57, teaches a particular V shaped channel p-FET structure that may be integrated with a conventional (100) n-FET or (100) p-FET structure within a CMOS structure to provide the CMOS structure with enhanced performance. The V shaped channel p-FET structure may be fabricated using a self-aligned sacrificial gate methodology.

As is understood by a person skilled in the art, the foregoing methodology may be desirable for a lower performance (i.e., comparatively increased gate linewidth dimension) MOSFET, but may also inherently prove difficult for manufacturing a higher performance (i.e., comparatively lower gate linewidth dimension) MOSFET since it may be difficult to scale down a gate length of a MOSFET and to rebuild a gate thereof.

CMOS devices and CMOS structures are certain to be of considerable continued interest within the semiconductor fabrication art due to their ease of fabrication, their ease of scalability and their inherent performance advantages. Thus, desirable are CMOS devices and CMOS structures having multiple crystallographic orientation semiconductor substrate regions, and methods for fabricating such CMOS devices and CMOS structures.

SUMMARY OF THE INVENTION

The invention includes a CMOS structure and a method for fabricating the CMOS structure. The CMOS structure uses a first active region that is planar and has a first crystallographic orientation, and a second active region that is topographic and has a second crystallographic orientation different than the first crystallographic orientation. The different crystallographic orientations for the first active region and the second active region provide for individual enhancements of charge carrier mobilities within a first CMOS device fabricated within the first active region and a second CMOS device (of polarity different than the first CMOS device) fabricated within the second active region. The invention also includes a semiconductor structure that includes a semiconductor device fabricated using an active region that comprises at least one V shaped groove.

A semiconductor structure in accordance with the invention includes a semiconductor substrate including an active region comprising at least one V shaped groove. The semiconductor structure also includes a gate electrode traversing the at least one V shaped groove non-parallel.

A CMOS structure in accordance with the invention includes a first device having a first polarity and located within a first active region of a semiconductor substrate. Within this particular CMOS structure, the first active region has a planar surface that has a first crystallographic orientation. This particular CMOS structure in accordance with the invention also includes a second device having a second polarity different than the first polarity and located within a second active region of the semiconductor substrate. Within this particular CMOS structure, the second active region has a topographic surface that has a second crystallographic orientation different than and absent the first crystallographic orientation.

Another CMOS structure in accordance with the invention includes a first device having a first polarity and first gate electrode located over a first active region of a semiconductor substrate. Within this other CMOS structure the first active region has a planar surface that has a first crystallographic orientation. This other CMOS structure also includes a second device having a second polarity different than the first polarity and a second gate located over a second active region of the semiconductor substrate. Within this other CMOS structure, the second active region has a topographic surface that has at least one V shaped groove having a second crystallographic orientation different than and absent the first crystallographic orientation. Within this other CMOS structure, the second gate is not parallel to the at least one V shaped groove.

A method for fabricating a CMOS structure in accordance with the invention includes forming within a semiconductor substrate: (1) a first active region having a first polarity and having a planar surface having a first crystallographic orientation; and (2) a second active region having a second polarity different than the first polarity and having a topographic surface having a second crystallographic orientation different than and absent the first crystallographic orientation. The method for fabricating the CMOS structure also includes forming a first device within the first active region and forming a second device within the second active region.

BRIEF DESCRIPTION OF THE DRAWINGS

The objects, features and advantages of the invention are understood within the context of the Description of the Preferred Embodiment, as set forth below. The description of the Preferred Embodiment is understood within the context of the accompanying drawings, that form a material part of this disclosure, wherein:

FIG. 1 to FIG. 14 show a series of schematic plan-view, schematic cross-sectional and schematic perspective-view diagrams of a CMOS structure fabricated in accordance with an embodiment of the invention.

DESCRIPTION OF THE PREFERRED EMBODIMENT

The invention, which includes a CMOS structure and a method for fabricating the CMOS structure, is understood within the context of the description that follows. The description that follows is understood within the context of the drawings described above. Since the drawings are intended for illustrative purposes, the drawings are not necessarily drawn to scale.

Figure 1:
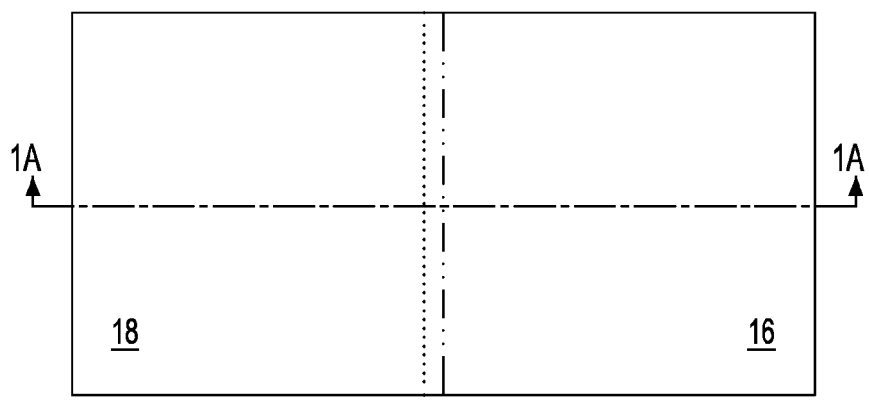
Figure 1A:
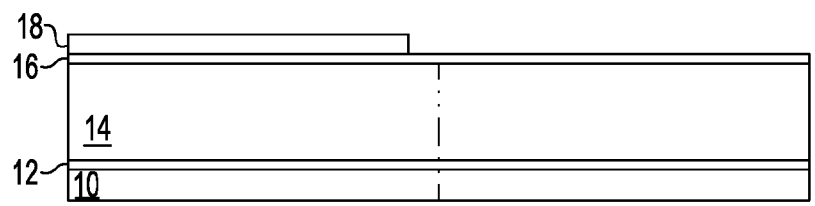

FIG. 1 to FIG. 14 show a series of schematic plan-view, schematic cross-sectional and schematic perspective-view diagrams of a CMOS structure in accordance with an embodiment of the invention. This particular embodiment of the invention comprises a preferred embodiment of the invention. FIG. 1 and FIG. 1A show a schematic plan-view and a schematic cross-sectional diagram of the CMOS structure at an early stage in the fabrication thereof in accordance with the preferred embodiment.

FIG. 1A in particular shows a base semiconductor substrate 10. A buried dielectric layer 12 is located upon the base semiconductor substrate 10 and a surface semiconductor layer 14 is located upon the buried dielectric layer 12. In an aggregate, the base semiconductor substrate 10, the buried dielectric layer 12 and the surface semiconductor layer 14 are called a semiconductor-on-insulator (SOI).

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 comprises a silicon or silicon-germanium alloy semiconductor material that has a thickness from about 0.5 to about 1.5 millimeters.

The buried dielectric layer 12 may comprise any of several dielectric materials. Non-limiting examples include oxides, nitrides and oxynitrides particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises at least in part an oxide of the semiconductor material from which is comprised the semiconductor substrate 10. Typically, the buried dielectric layer 12 has a thickness from about 50 to about 200 angstroms.

The surface semiconductor layer 14 may comprise any of the several semiconductor materials. The surface semiconductor layer 14 and the semiconductor substrate 10 may comprise either identical or different semiconductor materials with respect to chemical composition, dopant polarity, dopant concentration and crystallographic orientation. Typically, the surface semiconductor layer 14 comprises a (100) or (110) silicon or silicon-germanium alloy material that has a thickness from about 200 to about 2000 angstroms. As is illustrated in FIG. 1 and FIG. 1A, the surface semiconductor layer 14, as well as the base semiconductor substrate 10, have separate but adjoining left hand and right hand regions that are intended to comprise different polarities for fabrication of different polarity field effect transistors. Typically, the left hand region of the surface semiconductor layer 14 is intended for fabrication of an n-FET while the adjoining right hand region of the surface semiconductor layer 14 is intended for fabrication of a p-FET.

The semiconductor-on-insulator substrate that is illustrated in FIG. 1 may be fabricated using any of several methods. Non-limiting examples include layer lamination methods, layer transfer methods and separation by implantation of oxygen (SIMOX) methods.

Although the instant embodiment illustrates the invention within the context of the above described semiconductor-on-insulator substrate comprising the base semiconductor substrate 10, the buried dielectric layer 12 and the surface semiconductor layer 14, neither the instant embodiment nor the invention is intended to be so limited. Rather, the embodiment and the invention may alternatively be practiced using a bulk semiconductor substrate (that would otherwise result from absence of the buried dielectric layer 12 under circumstances where the base semiconductor substrate 10 and the surface semiconductor layer 14 have identical chemical composition and crystallographic orientation).

FIG. 1 and FIG. 1A also show a sacrificial layer 16 located upon the surface semiconductor layer 14 and an etch stop layer 18 located upon a portion of the sacrificial layer 16.

The sacrificial layer 16 may comprise any of several sacrificial materials. Non-limiting examples include sacrificial conductor materials, sacrificial semiconductor materials and sacrificial dielectric materials. Sacrificial dielectric materials are most common. Non-limiting examples of sacrificial dielectric materials include oxides, nitrides and oxynitrides of silicon in particular, although oxides, nitrides and oxynitrides of other elements are not excluded. Sacrificial dielectric materials may be formed using any of several methods. Non-limiting examples include thermal or plasma oxidation or nitridation methods, chemical vapor deposition methods and physical vapor deposition methods. Typically, the sacrificial layer 16 comprises a thermal silicon oxide sacrificial dielectric material that has a thickness from about 50 to about 200 angstroms.

The etch stop layer 18 may similarly comprise any of several etch stop materials. Non-limiting examples similarly include conductor etch stop materials, semiconductor etch stop materials and dielectric etch stop materials. The etch stop layer 18 may also be formed using methods including, but not limited to, thermal or plasma oxidation or nitridation methods, chemical vapor deposition methods and physical vapor deposition methods. Typically, the etch stop layer 18 comprises an amorphous silicon or polysilicon etch stop material that has a thickness from about 50 to about 150 angstroms.

Figure 2:
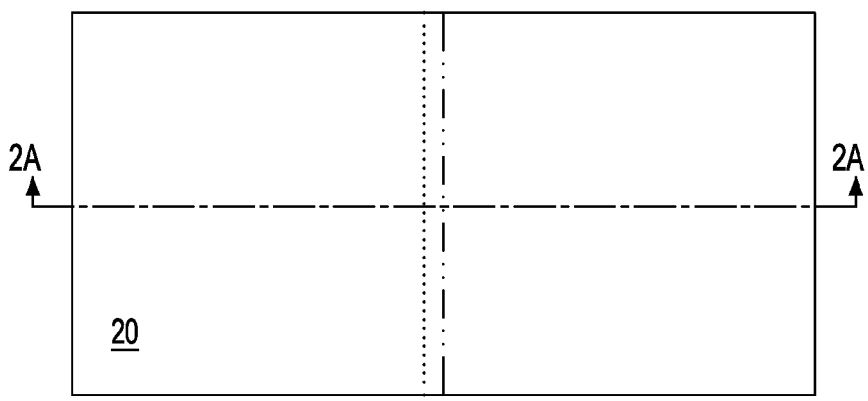
Figure 2A:
Figure 4:
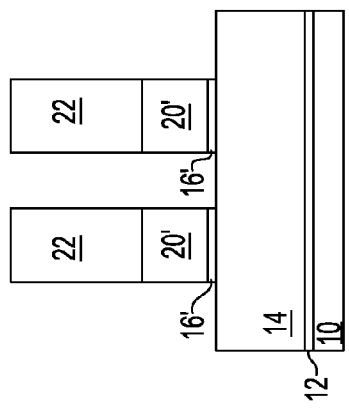
Figure 4C:
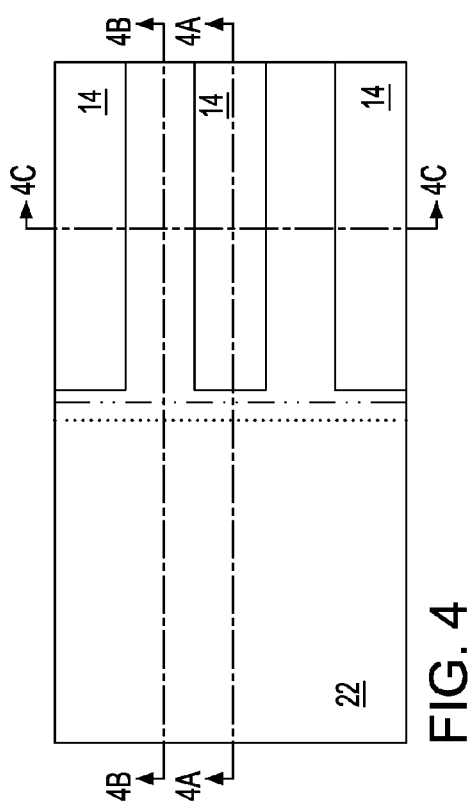
Figure 4B:
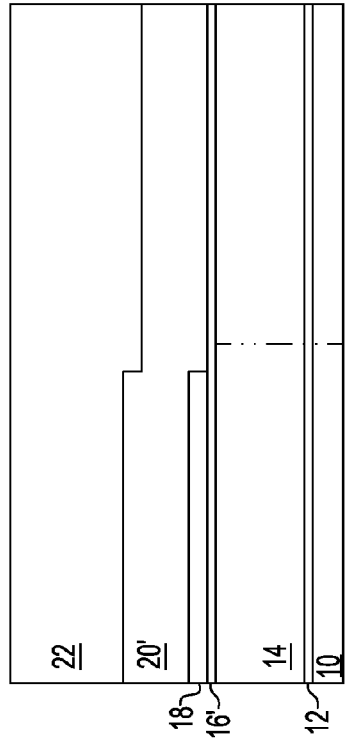
Figure 4A:
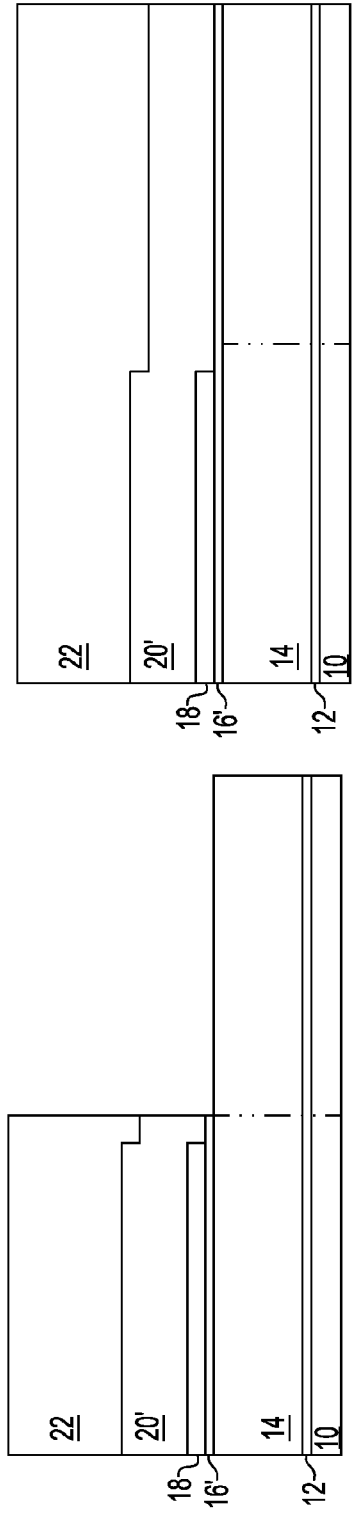
Figure 5:
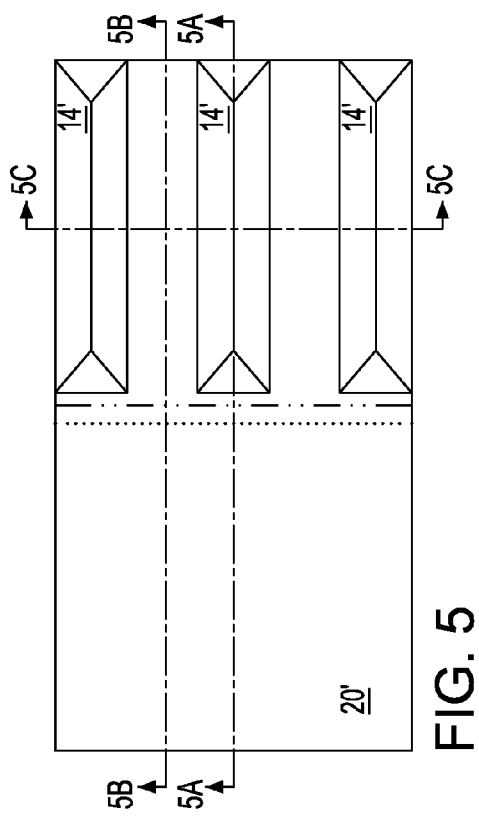
Figure 5C:
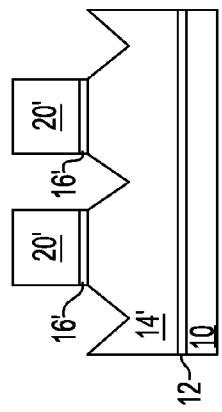
Figure 5B:
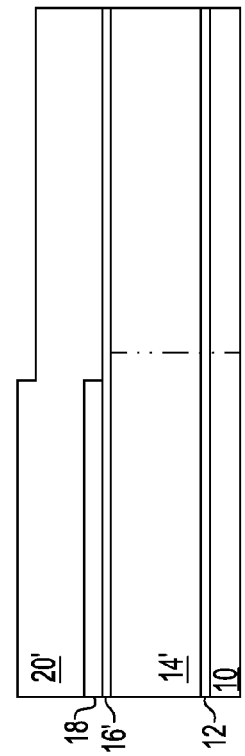
Figure 5A:
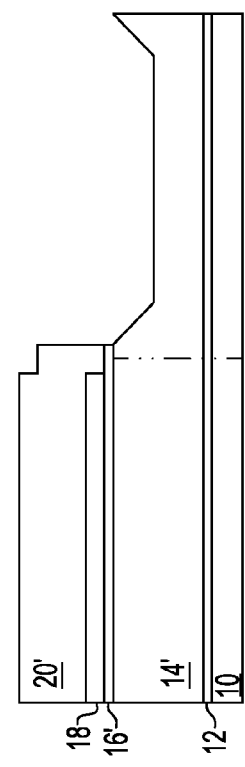
Figure 8C:
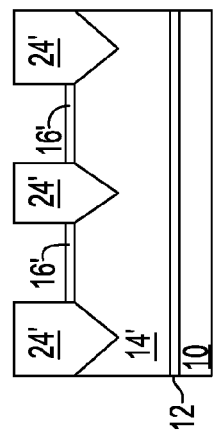
Figure 8:
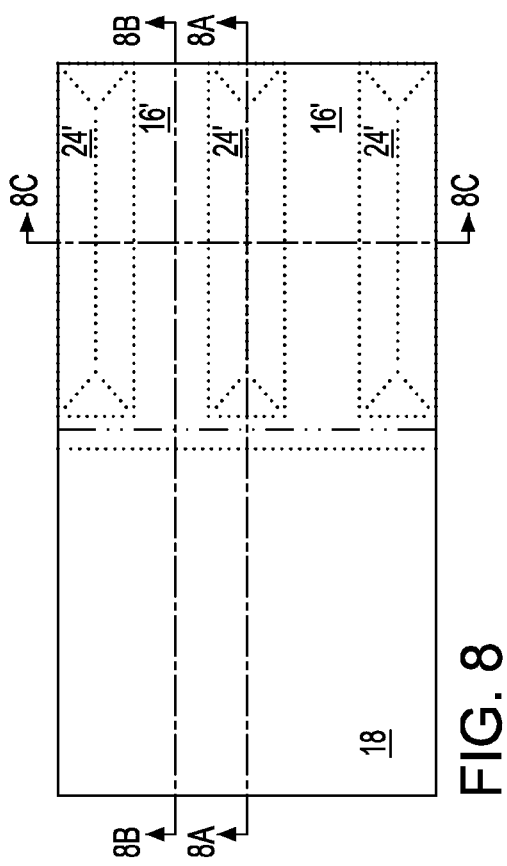
Figure 8B:
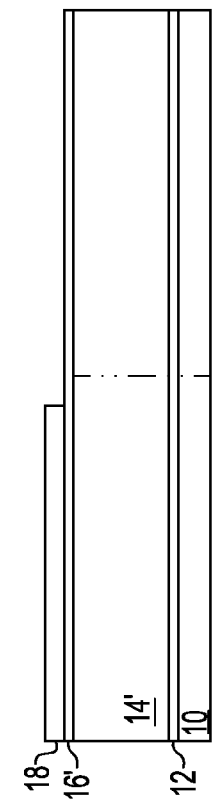
Figure 8A:
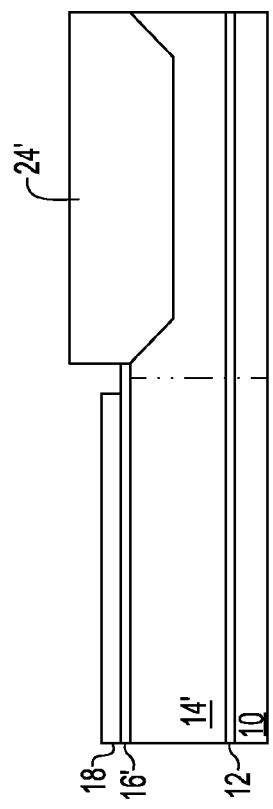
Figure 10:
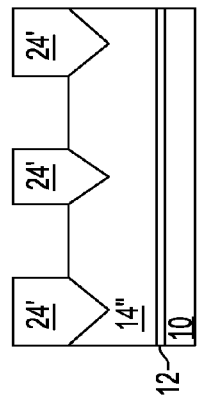
Figure 10C:
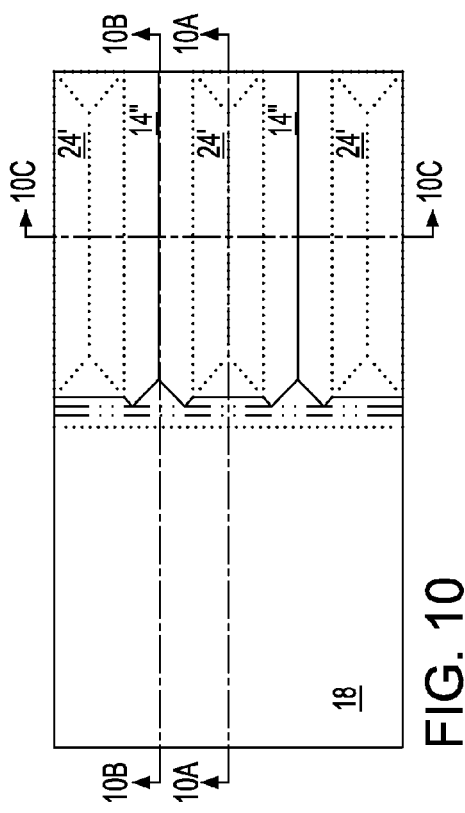
Figure 10A:
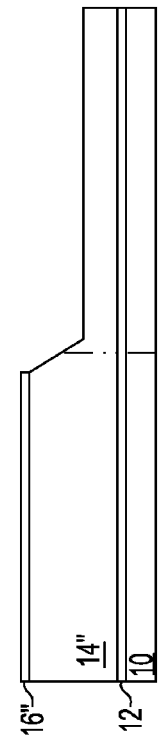
Figure 10B:
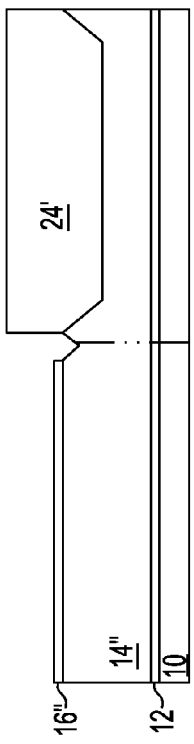

FIG. 2 and FIG. 2A show the results of further processing of the CMOS structure of FIG. 1 and FIG. 1A.

FIG. 2 and FIG. 2A show a hard mask layer 20 located upon the CMOS structure of FIG. 1 and FIG. 1A. The hard mask layer 20 may comprise any of several hard mask materials, provided that the hard mask materials have a composition different than the sacrificial layer 16 and the etch stop layer 18. Thus, under circumstances where, for example, the sacrificial layer 16 comprises a silicon oxide material and the etch stop layer 18 comprises an amorphous silicon material or a polysilicon material, the hard mask layer 20 comprises other than the silicon oxide material, the amorphous silicon material or the polysilicon material. Within the context of the foregoing preferred materials limitations for the sacrificial layer 16 and the etch stop layer 18, the hard mask layer 20 typically comprises either a silicon nitride material or a silicon oxynitride material that has a thickness from about 400 to about 800 angstroms.

FIG. 3, FIG. 3A, FIG. 3B and FIG. 3C show the results of further processing of the CMOS structure of FIG. 2 and FIG. 2A.

FIG. 3, FIG. 3A, FIG. 3B and FIG. 3C show a second mask layer 22 located upon the hard mask layer 20 within the CMOS structure of FIG. 2 and FIG. 2A.

The second mask layer 22 will in general comprise a mask material other than the hard mask material that comprises the hard mask layer 20. Thus, although not necessarily a limitation of the instant embodiment or the invention, the second mask layer 22 typically comprises a photoresist mask material. Candidate photoresist materials from which may be comprised the second mask layer 22 include, but are not limited to, positive photoresist materials, negative photoresist materials and hybrid photoresist materials. Any of the foregoing types of photoresist materials may be deposited using otherwise generally conventional spin coating, photoexposure and development methods. Typically, the second mask layer 22 comprises either a positive photoresist material or a negative photoresist material that has a thickness from about 1000 to about 3000 angstroms.

FIG. 4, FIG. 4A, FIG. 4B and FIG. 4C show the results of etching the hard mask layer 20 and the sacrificial layer 16 to form a hard mask layer 20' and a sacrificial layer 16'. The foregoing etching of the hard mask layer 20 and the sacrificial layer 16 to form the hard mask layer 20' and the sacrificial layer 16' uses the second mask layer 22 as a mask. The foregoing etching of the hard mask layer 20 and the sacrificial layer 16 may be undertaken using etch methods and materials that are conventional in the semiconductor fabrication art. Non-limiting examples include wet chemical etch methods and materials, as well as dry plasma etch methods and materials. Dry plasma etch methods are often preferred insofar as dry plasma etch methods and materials typically provide for vertical (or nearly vertical) sidewalls for the hard mask layer 20' and the sacrificial layer 16'. Typically, wet chemical etch methods use aqueous phosphoric acid etchants at elevated temperature for etching silicon nitride materials, and aqueous hydrofluoric acid etchants for etching silicon oxide materials. Typically, dry plasma etch methods use fluorine containing etchant gas compositions for etching either (with or without specificity) silicon nitride materials and silicon oxide materials.

FIG. 5, FIG. 5A, FIG. 5B and FIG. 5C first show the results of stripping the second mask layer 22 from the CMOS structure of FIG. 4, FIG. 4A, FIG. 4B and FIG. 4C.

The second mask layer 22 may be stripped using methods and materials that are conventional in the semiconductor fabrication art. Non-limiting examples include wet chemical stripping methods and materials, as well as dry plasma stripping methods and materials. Also contemplated are aggregates of the foregoing methods and materials.

FIG. 5, FIG. 5A, FIG. 5B and FIG. 5C also show the results of crystallographically specific etching the surface semiconductor layer 14 to form a surface semiconductor layer 14' while using the hard mask layer 20' and the sacrificial layer 16' as a mask. The crystallographically specific etching uses a crystallographically specific etchant. A particular crystallographically specific etchant that may be used when etching a (100) crystallographic orientation silicon semiconductor surface layer 14 as is preferred in accordance with the instant embodiment is a dilute aqueous ammonium hydroxide (i.e., $NH_4OH$) or aqueous tetramethylammoniumhydroxide (i.e., $(CH_3)_4NOH$) etchant solution. Either of the foregoing etchant solutions may be used within the context of generally conventional concentrations and exposure conditions to provide the V shaped notches in the surface semiconductor layer 14' that are illustrated most particularly within FIG. 5C. When using the foregoing crystallographically specific etchants in conjunction with a silicon surface semiconductor layer 14 that comprises a (100) surface crystallographic orientation, the faces of the V shaped notches within the silicon surface semiconductor layer 14' comprise a (111) crystallographic orientation.

The invention is not, however, limited to V shaped notches comprising only a (111) crystallographic orientation, but also includes V shaped notches including but not limited to (100), (110) and (111) crystallographic orientations. Any of the foregoing crystallographic orientations may be used with either an n-FET or a p-FET, as appropriate and as illustrated in further detail below.

FIG. 6, FIG. 6A, FIG. 6B and FIG. 6C show a filler layer 24 located and formed upon the CMOS structure of FIG. 5, FIG. 5A, FIG. 5B and FIG. 5C. The filler layer 24 may comprise any of several filler materials. Non-limiting examples include conductor filler materials, semiconductor filler materials and dielectric filler materials. The filler materials may in turn be formed using any of several methods. Non-limiting examples include chemical vapor deposition methods and physical vapor deposition methods. Typically, the filler layer 24 comprises a dielectric filler material such as a silicon oxide dielectric filler material that has a thickness from about 500 to about 1000 angstroms, and may be formed while using a chemical vapor deposition method. Within the context of the instant embodiment and the invention, the filler layer 24 comprises a different filler material than the hard mask material from which is comprised the hard mask layer 20'.

FIG. 7, FIG. 7A, FIG. 7B and FIG. 7C show a plurality of filler layers 24' that result from etching back the filler layer 24 to a thickness that exposes the hard mask layer 20'. The etching of the filler layer 24 to form the filler layers 24' that leave exposed the hard mask layer 20' may be effected using methods and materials that are conventional in the semiconductor fabrication art. Non-limiting examples include wet chemical etch methods and materials, and dry plasma etch methods and materials. Either of the foregoing etch methods and materials may be used. Typically, the filler layer 24 is etched to form the filler layer 24' that has a recess R from about 100 to about 300 angstroms beneath an exposed surface of the hard mask layer 20', as is illustrated more specifically in FIG. 7A.

FIG. 8, FIG. 8A, FIG. 8B and FIG. 8C show the results of stripping completely the hard mask layer 20' from the semiconductor structure of FIG. 7, FIG. 7A, FIG. 7B and FIG. 7C.

The hard mask layer 20' may be stripped using methods and materials that are conventional in the semiconductor fabrication art. Non-limiting examples also include wet chemical stripping methods and materials, as well as dry plasma stripping methods and materials. Typically, when comprising a silicon nitride material, the hard mask layer 20' may be stripped using an aqueous phosphoric acid solution at an elevated temperature. Other methods and materials may alternatively be used.

FIG. 9, FIG. 9A, FIG. 9B and FIG. 9C show a sacrificial layer 16" that results from etching the sacrificial layer 16' while using the etch stop layer 18 as a mask. The sacrificial layer 16" is thus aligned beneath the etch stop layer 18. Such etching of the sacrificial layer 16' to provide the sacrificial layer 16" also leaves exposed portions of the surface semiconductor layer 14' interposed between the filler layers 24'. The sacrificial layer 16' when comprising a thermal silicon oxide material may under certain circumstances be etched selectively with respect to the filler layers 24' when the filler layers 24' comprise a different silicon oxide material, such as a deposited silicon oxide material. Typical etchants for etching the sacrificial layer 16' to form the sacrificial layer 16" include plasma etchants comprising fluorine containing etchant gas compositions, as well as certain other gaseous etchants and aqueous wet chemical etchants including hydrofluoric acid containing materials.

FIG. 10, FIG. 10A, FIG. 10B and FIG. 10C show a surface semiconductor layer 14" that results from further etching of the surface semiconductor layer 14' while again using a crystallographically specific etchant, along with the filler layers 24' and the sacrificial layer 16" as a mask layer. Such a crystallographically specific etchant also strips the etch stop layer 18 from the sacrificial layer 16" when the etch stop layer 18 preferably comprises an amorphous silicon material or a polysilicon material. The foregoing crystallographically specific etching thus provides a completely serrated or corrugated multiple V shaped surface to the surface semiconductor layer 14" since additional V shaped notches are formed located within the surface semiconductor layer 14" at locations other than those beneath the filler layers 24'. The completely serrated or corrugated multiple V shaped surface of the surface semiconductor layer 14" is illustrated most specifically within FIG. 10C.

The crystallograhically specific etchant used for etching the surface semiconductor layer 14' that is illustrated in FIG. 9, FIG. 9A, FIG. 9B and FIG. 9C to provide the surface semiconductor layer 14" that is illustrated in FIG. 10, FIG. 10A, FIG. 10B and FIG. 10C is analogous, equivalent or identical to the crystallographically specific etchant that is used for etching the surface semiconductor layer that is illustrated in FIG. 4, FIG. 4A, FIG. 4B and FIG. 4C to form the surface semiconductor layer 14' that is illustrated in FIG. 5, FIG. 5A, FIG. 5B and FIG. 5C. Again, more specifically, such a crystallographic specific etchant comprises a dilute aqueous ammonium hydroxide etchant or a dilute aqueous tetramethylammoniumhydroxide etchant. Either of the foregoing etchants may be used while employing generally conventional conditions.

FIG. 11, FIG. 11A, FIG. 11B and FIG. 11C show the results of stripping the filler layers 24' and the sacrificial layer 16" from the semiconductor structure of FIG. 10, FIG. 10A, FIG. 10B and FIG. 10C. The filler layers 24' and the sacrificial layer 16" may be stripped using methods and materials that are conventional in the semiconductor fabrication art. Non-limiting examples of methods and materials include wet chemical etchant methods and materials, and dry plasma etchant methods and materials. Typically, wet chemical etchant methods and materials that use an aqueous hydrofluoric acid etchant material are used.

FIG. 12, FIG. 12A, FIG. 12B and FIG. 12C first show the results of masking the left hand side of the CMOS structure of FIG. 11, FIG. 11A, FIG. 11B and FIG. 11C with a third mask layer 26. The third mask layer 26 may comprise mask materials, have thickness dimensions and be formed using methods that are analogous, equivalent or identical to the mask materials, thickness dimensions and methods that are used for forming the mask layer 22 that is illustrated in FIG. 4, FIG. 4A, FIG. 4B and FIG. 4C. Typically, the mask layer 26 comprises a photoresist mask material that has a thickness from about 1000 to about 3000 angstroms and that leaves exposed a right hand side of the CMOS structure.

FIG. 12, FIG. 12A, FIG. 12B and FIG. 12C also show a surface semiconductor layer 14''' that results from ion implanting the surface semiconductor layer 14". The ion implanting uses a dose of implanting ions 27 that is intended to provide a chemical modification and compositional difference at a lower serrated and corrugated portion of the surface semiconductor layer 14'''. Such a lower serrated and corrugated portion compositional difference is provided region-selectively by selecting a projected range for the implanting ions 27 that is equal to a minimum thickness of the surface semiconductor layer 14".

From a practical perspective when the surface semiconductor layer 14" comprises a silicon semiconductor material, the implanting ions 27 may comprise germanium implanting ions since etchants are known in the art that etch a silicon-germanium alloy material selectively to a silicon material. Other implanting ions may also be used. Typically, the implanting ions 27 are provided at a dose from about $3\times10^{14}$ to about $3\times10^{15}$ ions per square centimeter and an energy from about 25 to about 150 keV to provide an implanting atoms concentration within the lower serrated and corrugated portion of the surface semiconductor layer 14'''.

FIG. 13, FIG. 13A, FIG. 13B and FIG. 13C first show the results of patterning the surface semiconductor layer 14''' to form a first surface semiconductor layer 14a''' and a second surface semiconductor layer 14b'''. The first surface semiconductor layer 14a''' comprises a planar and flat surface that within the context of the instant embodiment preferably comprises a (100) crystallographic orientation. The second surface semiconductor layer 14b''' comprises the serrated and corrugated multiple V shaped surface that preferably comprises a (111) crystallographic orientation absent any portion that comprises the (100) crystallographic orientation. The foregoing patterning may be affected using methods and materials that are conventional in the semiconductor fabrication art. Non-limiting examples include wet chemical etch methods and materials, and dry plasma etch methods and materials. Dry plasma etch methods and materials are generally more common. Dry plasma etch methods and materials typically also use chlorine containing etchant gas compositions for etching silicon or silicon-germanium alloy materials.

FIG. 13C in particular also illustrates an ancillary result of etching a lower lying (preferably) silicon-germanium alloy portion of the surface semiconductor layer 14''' that is illustrated in FIG. 12C to form the second surface semiconductor layer 14b''' having a plurality of voids 15 located thereunder. The voids 15 are also bounded by the buried dielectric layer 12. As suggested above, the foregoing etching may be affected using methods and materials that are conventional in the semiconductor fabrication art. Wet chemical etchant methods and materials provide perhaps more practical etchant methods and materials when forming the voids 15 since they are inherently isotropic etchant methods and materials. Nonetheless, some higher pressure plasma etch methods and materials may also be used since under certain circumstances they too may be isotropic. A preferred etchant for etching, in particular, silicon-germanium alloy portions of the surface semiconductor layer 14''' that is illustrated in FIG. 12C to provide the surface semiconductor layer 14b''' that is illustrated in FIG. 13C includes fluorine containing etchant gases such as carbon tetrafluoride (i.e., $CF_4$) or trifluoromethane (i.e., $CHF_3$) as etchant materials. As is understood by a person skilled in the art, the ion implantation processing sequence of FIG. 12C and the isotropic etching processing sequence of FIG. 13C provides the surface semiconductor layer 14b''' that has the serrated and corrugated structure that in turn has a single thickness from about 200 to about 1000 angstroms.

As is understood by a person skilled in the art, the voids 15 within the CMOS structure of FIG. 13C provide value since the voids 15 comprise a lower permittivity material (i.e., a lower dielectric constant dielectric material) than solid dielectric materials that may otherwise typically be used for dielectric isolation purposes in place of the voids 15. Such superior dielectric isolation is desirable within the CMOS structure of FIG. 13, FIG. 13A, FIG. 13B and FIG. 13C insofar as such superior dielectric isolation provides for a reduced electrical interaction between a source/drain region and a channel region within a field effect transistor that is fabricated using the surface semiconductor layer 14b''' that is illustrated in FIG. 13, FIG. 13A, FIG. 13B and FIG. 13C in part as a channel region within the field effect transistor. Such a reduced electrical interaction between the source/drain region and the channel region in turn also provides for a reduced occurrence of short channel effects within the field effect transistor. Optionally and under certain circumstances preferably, the voids 15 may be refilled with a comparatively low (i.e., less than about 4) dielectric constant material.

FIG. 13, FIG. 13A, FIG. 13B and FIG. 13C finally show an isolation region 28 located surrounding the newly formed first and second surface semiconductor layers 14a''' and 14b'''. The isolation region 28 may comprise generally conventional dielectric isolation materials. Non-limiting examples of such dielectric isolation materials include oxides, nitrides and oxynitrides of silicon. Again, oxides, nitrides and oxynitrides of other elements are not excluded. The dielectric isolation materials may be formed using methods that are conventional in the semiconductor fabrication art. Non-limiting examples of methods include chemical vapor deposition methods and physical vapor deposition methods. Typically, the isolation region 28 comprises at least in part a silicon oxide dielectric isolation material.

FIG. 14, FIG. 14A, FIG. 14B and FIG. 14C show a first transistor T1 located using the first surface semiconductor layer 14a''' as an active region (i.e., including channel region and source/drain regions) and a second transistor T2 located using the second surface semiconductor layer 14b''' as an active region (i.e., also including channel region and source/drain regions).

Each of the first field effect transistor T1 and the second field effect transistor T2 comprises: (1) a gate dielectric 30 located upon the first surface semiconductor layer 14a''' or the second surface semiconductor layer 14b'''; (2) a gate electrode 32 located upon the gate dielectric 30; and (3) a spacer layer 34 located encircling sidewalls of the gate dielectric 30 and the gate electrode 32; and (4) a pair of source/drain regions 36 located within the first surface semiconductor layer 14a''' or the second surface semiconductor layer 14b''' and separated by the gate electrode 32. Each of the foregoing layers and structures may comprise materials and have dimensions that are conventional in the semiconductor fabrication art. Each of the foregoing layers and structures may also be formed using methods that are conventional in the semiconductor fabrication art.

The gate dielectrics 30 may comprise conventional dielectric materials such as oxides, nitrides and oxynitrides of silicon that have a dielectric constant from about 4 to about 20, measured in vacuum. Alternatively, the gate dielectrics 30 may also comprise generally higher dielectric constant dielectric materials having a dielectric constant from about 20 to at least about 100. Such higher dielectric constant dielectric materials may include, but are not limited to hafnium oxides, hafnium silicates, titanium oxides, lanthanum oxides, barium-strontium-titantates (BSTs) and lead-zirconate-titantates (PZTs). The gate dielectrics 30 may be formed using any of several methods that are appropriate to their material(s) of composition. Included, but not limiting are thermal or plasma oxidation or nitridation methods, chemical vapor deposition methods (including atomic layer chemical vapor deposition methods) and physical vapor deposition methods (including sputtering methods). Typically, the gate dielectrics 30 comprises a thermal silicon oxide dielectric material that has a thickness from about 8 to about 70 angstroms.

The gate electrodes 32 may comprise materials including, but not limited to, certain metals, metal alloys, metal nitrides and metal silicides, as well as laminates thereof and composites thereof. The gate electrodes 32 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials that may also optionally be germanium doped). Similarly, the foregoing materials may also be formed using any of several methods. Non-limiting examples include salicide methods, chemical vapor deposition methods (including atomic layer chemical vapor deposition methods) and physical vapor deposition methods, such as, but not limited to evaporative methods and sputtering methods. Typically, the gate electrodes 32 comprise a doped polysilicon material that has a thickness from about 600 to about 2000 angstroms.

The spacers 34 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the isolation region 28, although the materials may under certain circumstances be different. The spacer layers 34 are also formed with the distinctive inward pointing spacer shape by using a blanket layer deposition and anisotropic etchback method that requires that the pair of spacer layers 34 typically comprise a different spacer material than an isolation material from which is comprised the isolation region 28. Typically, the spacer layers 34 comprises a silicon nitride spacer material when the isolation region 28 comprises a silicon oxide isolation material.

Finally, the source/drain regions 36 within the first transistor T1 comprises a generally conventional n-conductivity type dopant (for an n-FET first transistor T1) that will typically comprise either a phosphorus dopant or an arsenic dopant. Similarly, the source/drain regions 36 within the second transistor T2 comprises a generally conventional p-conductivity type dopant (for a p-FET second transistor T2) that will typically comprise either a boron dopant or a indium dopant. As is understood by a person skilled in the art, the source/drain regions 36 are formed using a two step ion implantation method. A first ion implantation process step within the method uses the gate electrode 32, absent the spacer 34, as a mask to form extension regions which extend beneath the spacer layers 34. A second ion implantation process step uses the gate electrode 32 and the spacer layer 34 as a mask to form the larger contact region portions of the source/drain regions 36, while simultaneously incorporating the extension regions. Dopant levels are from about 1e19 to about 1e21 dopant atoms per cubic centimeter within each of the source/drain regions 36. Extension regions within the source/drain regions 36 may under certain circumstances be more lightly doped than contact regions with the source/drain regions 36, although such differential doping concentrations are not a requirement of the invention.

As a related feature of the instant embodiment, and as illustrated more particularly within FIG. 14 and FIG. 14C, exposed surfaces of source/drain regions 36 within the second surface semiconductor layer 14b''' are serrated and corrugated with a plurality of V shaped grooves or notches. Similarly, the gate electrode 32 crosses the plurality of V shaped grooves in a non-parallel disposition, and more particularly in a nominally perpendicular disposition.

Such a serration and corrugation provides the source/drain regions 36 within the second surface semiconductor layer 14b''' with an increased surface contact area when subsequently forming contact studs contacting the source/drain regions 36 within the second surface semiconductor layer 14b'''. In turn, such increased surface contact area provides for a lower contact resistance of the contact studs contacting the source/drain regions 36 within the second surface semiconductor layer 14b'''.

In addition, the non-parallel and preferably perpendicular passing of the gate 32 with respect to the V shaped grooves is desirable since a parallel disposition of the gate 32 with respect to the V shaped grooves provides an increased effective gate length for a given particular gate 32 critical dimension.

Figure 15:
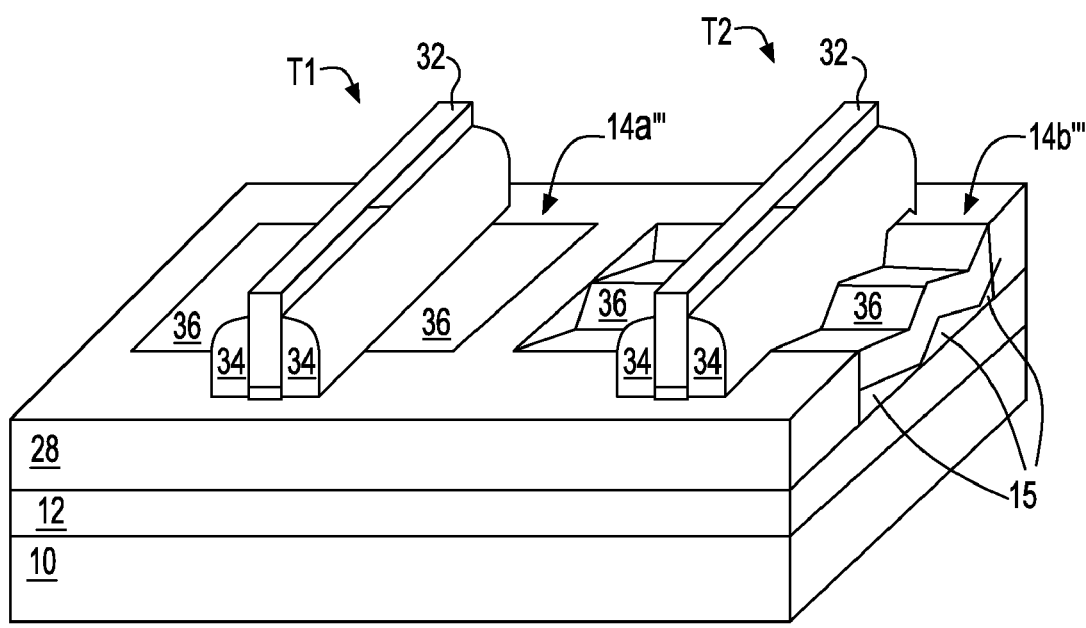
FIG. 15 shows a schematic perspective-view of the semiconductor structure of FIG. 14.

FIG. 15 shows a schematic perspective-view diagram of the semiconductor structure of FIG. 14, FIG. 14A, FIG. 14B and FIG. 14C.

FIG. 15 shows a CMOS structure including a first transistor T1 and a second transistor T2. The first transistor T1 is preferably an n-FET that uses the first surface semiconductor layer 14a''' (that comprises a planar flat surface that preferably has a (100) crystallographic orientation) as a first active region. The second transistor T2 is preferable a p-FET that uses the second surface semiconductor layer 14b''' (that comprises a topographic serrated and corrugated multiple V grooved surface that preferably has a (111) crystallographic orientation absent any (100) crystallographic orientation) as a second active region. As is understood by a person skilled in the art, the use of different crystallographic orientations for active regions of the first transistor T1 and the second transistor T2 provides for enhanced charge carrier mobility within both the first transistor T1 and the second transistor T2.

The particular preferred embodiment also contemplates that the second active region 14b''' has a single thickness (incident to a selective ion implantation and selective etch process) thus provides a plurality of voids 15 that separate portions of the second surface semiconductor layer 14b''' from a buried dielectric layer 12. Such voids 15 provide enhanced source/drain 36 to channel isolation within the second transistor T2. Similarly, the source/drain regions 36 within the second transistor T2 comprise serrated and corrugated surfaces that allow for enhanced contact area when forming contact studs contacting the source/drain regions 36 within the second transistor T2.

The foregoing preferred embodiment is illustrative of the invention rather than limiting of the invention. Revisions and modifications may be made to methods, materials structures and dimensions of a CMOS structure in accordance with the foregoing preferred embodiment, while still providing a CMOS structure in accordance with the invention, further in accordance with the accompanying claims.

What is claimed is:

1. A method for fabricating a complementary metal oxide semiconductor (CMOS) structure comprising:
   forming within a semiconductor substrate:
   a first active region having a first polarity and including a first surface semiconductor layer having a planar surface and a first crystallographic orientation, and
   a second active region having a second polarity different than the first polarity and including a second surface semiconductor layer having a topographic surface and a second crystallographic orientation different than and absent the first crystallographic orientation and at least one void located beneath the second surface semiconductor layer and having a same topography as the second surface semiconductor layer; and
   forming a first device within the first active region and forming a second device within the second active region.

2. The method of claim 1 wherein the forming within the semiconductor substrate the first active region and the second active region uses one of a semiconductor on insulator substrate and a bulk semiconductor substrate that provide the first active region and the second active region of the same semiconductor material.

3. The method of claim 1 wherein the forming the second active region including the second surface semiconductor layer having the topographic surface and the second crystallographic orientation uses a crystallographically specific etchant to provide the second crystallographic orientation.

4. The method of claim 1 wherein the second surface semiconductor layer having the topographic surface has at least one V shaped groove.

5. The method of claim 1 wherein the forming the second device includes forming a second gate electrode non-parallel to a topography within the second surface semiconductor layer having the topographic surface.

6. The method of claim 1 wherein the second surface semiconductor layer having the topographic surface has a plurality of V shaped grooves.

7. A method for fabricating a complementary metal oxide semiconductor (CMOS) structure comprising:
   forming within a semiconductor substrate:
   a first active region having a first polarity and including a first surface semiconductor layer having a planar surface and a first crystallographic orientation, and
   a second active region having a second polarity different than the first polarity and including a second surface semiconductor layer having a topographic surface and a second crystallographic orientation different than and absent the first crystallographic orientation;
   forming at least one void contained within the semiconductor substrate beneath the second surface semiconductor layer, said at one void having a same topography as the second surface semiconductor layer; and
   forming a first device within the first active region and forming a second device within the second active region.

8. A method for fabricating a complementary metal oxide semiconductor (CMOS) structure comprising:
   forming within a semiconductor substrate:
   a first active region having a first polarity and including a first surface semiconductor layer having a planar surface and a first crystallographic orientation, and a second active region having a second polarity different than the first polarity and including a second surface semiconductor layer having a topographic surface formed using a two mask two-step etch method and having a second crystallographic orientation different than and absent the first crystallographic orientation;

forming at least one void contained within the semiconductor substrate beneath the second active region surface semiconductor layer, said at one void having a same topography as the second surface semiconductor layer; and forming a first device within the first active region and forming a second device within the second active region.

9. The method of claim 1 further comprising filling said at least one void with a dielectric material having a dielectric constant of less than about 4.

10. The method of claim 1 wherein said at least one void is bounded by an underlying buried dielectric layer of the semiconductor substrate.

11. The method of claim 7 further comprising filling said at least one void with a dielectric material having a dielectric constant of less than about 4.

12. The method of claim 7 wherein said at least one void is bounded by an underlying buried dielectric layer of the semiconductor substrate.

13. The method of claim 8 further comprising filling said at least one void with a dielectric material having a dielectric constant of less than about 4.

14. The method of claim 8 wherein said at least one void is bounded by an underlying buried dielectric layer of the semiconductor substrate.

* * * * *